US012667027B2

(12) United States Patent
Wu et al.

(10) Patent No.: US 12,667,027 B2
(45) Date of Patent: Jun. 23, 2026

(54) ROUTING STRUCTURE OF DISPLAY SCREEN

(71) Applicant: AUO Corporation, Hsinchu City (TW)

(72) Inventors: Yueh-Chi Wu, Hsinchu City (TW);
Chia-Jung Wu, Hsinchu City (TW);
Ti-Kuei Yu, Hsinchu City (TW);
Ya-Ling Hsu, Hsinchu City (TW)

(73) Assignee: AUO Corporation, Hsinchu City (TW)

( * ) Notice: Subject to any disclaimer, the term of this patent is extended or adjusted under 35 U.S.C. 154(b) by 0 days.

(21) Appl. No.: 18/926,367

(22) Filed: Oct. 25, 2024

(65) Prior Publication Data

US 2025/0210604 A1 Jun. 26, 2025

(30) Foreign Application Priority Data

Dec. 21, 2023 (TW) ................................. 112150167
May 29, 2024 (TW) ................................. 113119895

(51) Int. Cl.
*H10W 90/00* (2026.01)

(52) U.S. Cl.
CPC .................................... *H10W 90/00* (2026.01)

(58) Field of Classification Search
CPC ........................... H01L 25/167; H01L 25/0753
See application file for complete search history.

(56) References Cited

U.S. PATENT DOCUMENTS 11,790,822 B1 10/2023 Yeh et al.
2011/0057861 A1* 3/2011 Cok ...................... H10K 50/813
345/1.3

| | | | | |
|---|---|---|---|---|
| 2016/0307479 | A1* | 10/2016 | Cox ...................... | G09F 9/3026 |
| 2017/0047393 | A1* | 2/2017 | Bower ................ | G06F 3/04166 |
| 2017/0148374 | A1* | 5/2017 | Lee ...................... | G02F 1/13336 |
| 2018/0190210 | A1 | 7/2018 | Chung | |
| 2018/0323180 | A1* | 11/2018 | Cok ...................... | H10W 90/00 |
| 2019/0333901 | A1* | 10/2019 | Cok ...................... | H10P 72/74 |
| 2022/0293635 | A1* | 9/2022 | Zhang ................... | H10D 86/60 |
| 2023/0059512 | A1* | 2/2023 | Chen ...................... | H10H 20/01 |
| 2023/0217750 | A1* | 7/2023 | Cho ..................... | H10K 50/844 |
| | | | | 257/40 |

(Continued)

FOREIGN PATENT DOCUMENTS

| | | |
|---|---|---|
| CN | 117012109 A | 11/2023 |
| CN | 118015974 A | 5/2024 |

(Continued)

*Primary Examiner* — Ibrahim A Khan

(74) *Attorney, Agent, or Firm* — WPAT, PC

(57) ABSTRACT

A routing structure of a display screen includes a display screen, a circuit board, a plurality of driver chips, a plurality of first light-emitting units, a plurality of second light-emitting units, and a light-emitting unit routing assembly. The first light-emitting units are disposed on opposite sides of the display screen. The second light-emitting units are disposed on a second side opposite to the first side of the display screen. The light-emitting unit routing assembly includes a plurality of first routings and a plurality of second routings. The first routings are connected between at least one of the driver chips and the first light-emitting units. The second routings are connected between the at least one of the driver chips and the second light-emitting units. A length of the first routings is similar to a length of the second routings.

18 Claims, 15 Drawing Sheets

(56)           References Cited

U.S. PATENT DOCUMENTS

2024/0063232  A1*   2/2024  Jia ........................... H10D 86/60
2024/0096905  A1*   3/2024  Fan ........................ H10D 84/01
2024/0334663  A1*  10/2024  Kim ................... H05K 7/20127

FOREIGN PATENT DOCUMENTS

TW          202321616  A      6/2023
TW          202329451  A      7/2023

* cited by examiner

RS

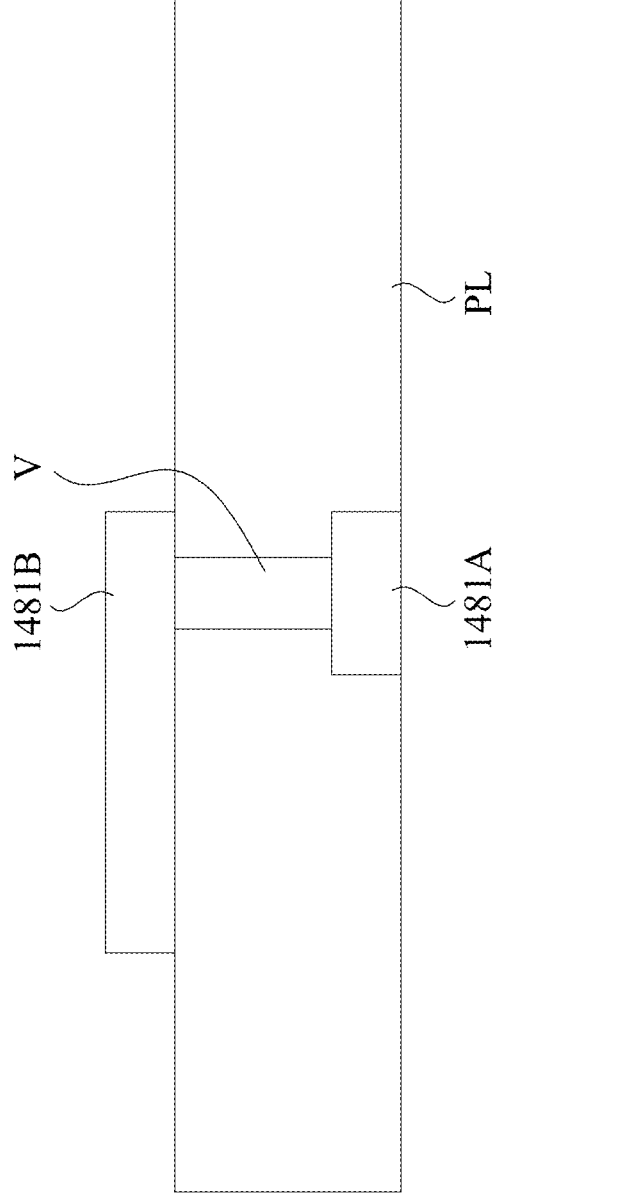
Fig. 7
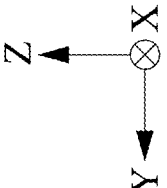

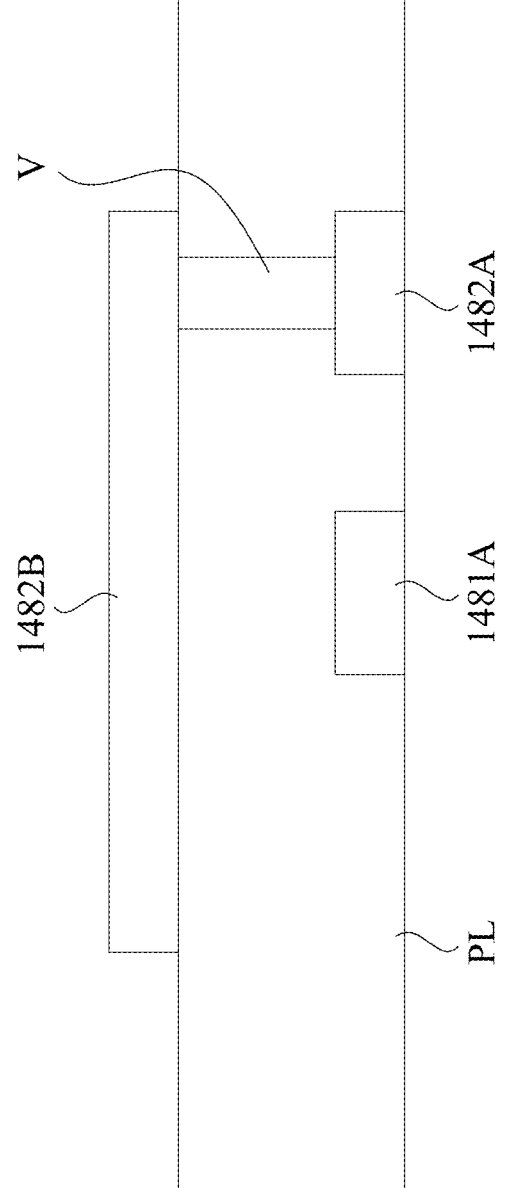
Fig. 8
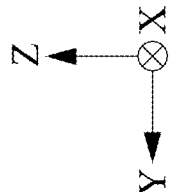

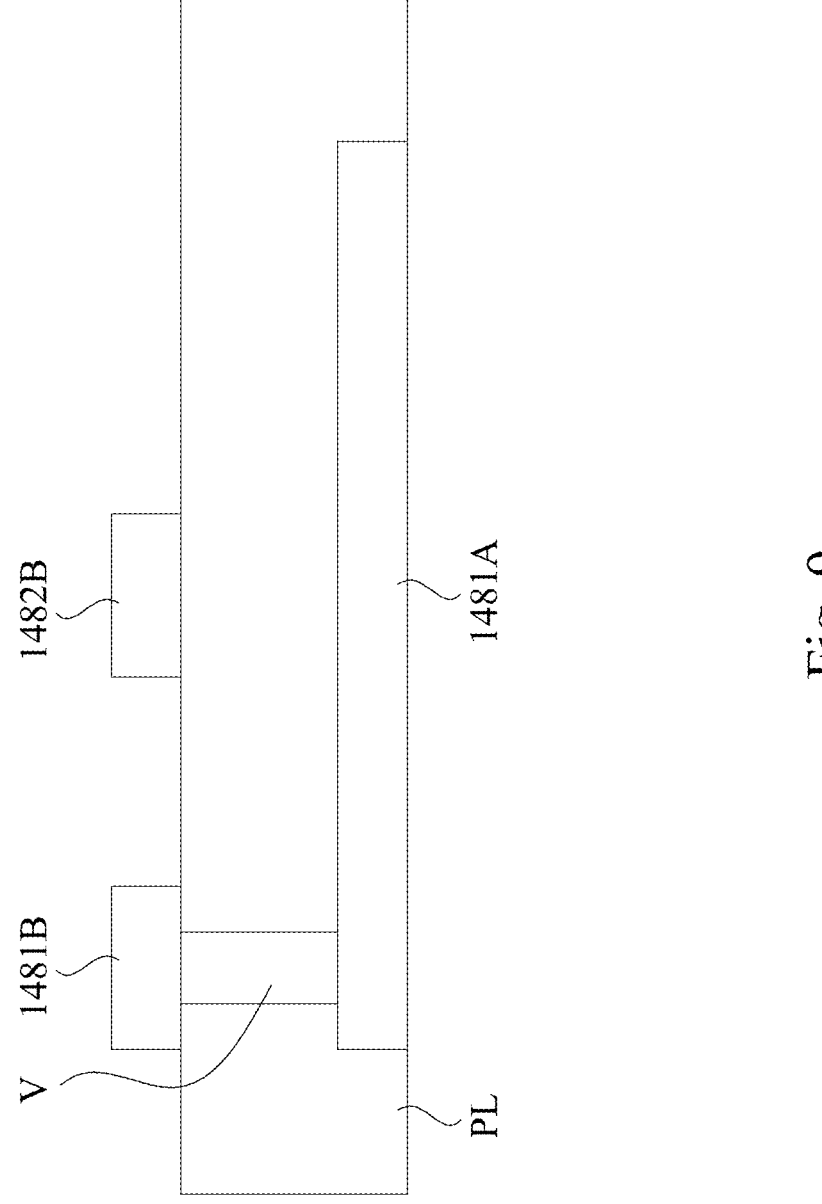
Fig. 9
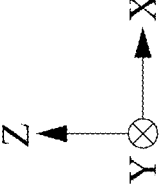

Fig. 13

ROUTING STRUCTURE OF DISPLAY SCREEN

CROSS-REFERENCE TO RELATED APPLICATION

This application claims priority to Taiwan Application Serial Number 112150167, filed Dec. 21, 2023, and Taiwan Application Serial Number 113119895, filed May 29, 2024, the disclosures of which are incorporated herein by reference in their entireties.

BACKGROUND

Field of Invention

The present invention relates to a routing structure of a display screen.

Description of Related Art

In recent years, due to the increasing demands for ultra-large-size screens, most of the above demands are met by splicing multiple display screens. In order to achieve an almost seamless visual effect between display screens, a solution is generally to dispose additional light-emitting units at the edges of the display screens. However, conventional display screens fail to satisfy. How to propose a routing structure of a display screen that can provide almost visual seamless splicing between display screens is one of the problems that the industry urgently wants to invest in research and development resources to solve.

SUMMARY

In view of this, one purpose of the present disclosure is to provide a routing structure of a display screen that can solve the aforementioned problems.

In order to achieve the above objective, in accordance with an embodiment of the present disclosure, a routing structure of a display screen includes a display screen, a circuit board, a plurality of driver chips, a plurality of first light-emitting units, a plurality of second light-emitting units, and a light-emitting unit routing assembly. The display screen includes a plurality of sub-pixel units. The circuit board is located at the first side of the display screen. The driver chips are connected to the circuit board and disposed at the first side of the display screen. The first light-emitting units are disposed on opposite sides of the display screen. The opposite sides of the display screen are respectively connected to the first side. The second light-emitting units are disposed at a second side opposite to the first side of the display screen. The light-emitting unit routing assembly is connected to the driver chips. The light-emitting unit routing assembly includes a plurality of first routings and a plurality of second routings. The first routings are connected between at least one of the driver chips and the first light-emitting units. The second routings are connected between at least one of the driver chips and the second light-emitting units. A length of the first routings is similar to a length of the second routings.

In one or more embodiments of the present disclosure, one of the driver chips close to the opposite sides of the display screen is connected to the first light-emitting units away from the first side of the display screen by the first routings, and one of the driver chips away from the opposite sides of the display screen is connected to the first light-emitting units close to the first side of the display screen by the first routings.

In one or more embodiments of the present disclosure, the routing structure of the display screen further includes a display screen routing and a glass substrate. The display screen routing is disposed on a side of the glass substrate. The light-emitting unit routing assembly is disposed on the other side of the glass substrate.

In one or more embodiments of the present disclosure, the routing structure of the display screen further includes a display screen routing, a first substrate, and a second substrate located over the first substrate.

In one or more embodiments of the present disclosure, the display screen routing is disposed on the first substrate, and the light-emitting unit routing assembly is disposed on the second substrate.

In order to achieve the above objective, in accordance with an embodiment of the present disclosure, a routing structure of a display screen includes a display screen, a circuit board, a plurality of first light-emitting units, a plurality of second light-emitting units, and a light-emitting unit routing assembly. The display screen includes a plurality of sub-pixel units. The circuit board is located at the first side of the display screen. The first light-emitting units are disposed on opposite sides of the display screen. The opposite sides of the display screen are respectively connected to the first side. The second light-emitting units are disposed at a second side opposite to the first side of the display screen. The light-emitting unit routing assembly is connected to the circuit board. The light-emitting unit routing assembly includes a plurality of first routings and a plurality of second routings. The first routings are connected to the first light-emitting units. The second routings are connected to the second light-emitting units. A length of the first routings is similar to a length of the second routings. A resolution of the display screen is M*N. The display screen accommodates 3M of the sub-pixel units in an extending direction of the first side or the second side. The display screen accommodates N of the sub-pixel units in a direction from the first side to the second side.

In one or more embodiments of the present disclosure, the light-emitting unit routing assembly further includes a plurality of dummy routings. The display screen has 3M of routing inlets located on the first side. The 3M of routing inlets are configured to accommodate the first routings, the second routings, and the dummy routings.

In one or more embodiments of the present disclosure, the first routings, the second routings, and the dummy routings are alternately disposed at an end of the display screen close to the 3M of routing inlets.

In one or more embodiments of the present disclosure, the first routings, the second routings, and the dummy routings are respectively convergently arranged at an end of the display screen close to the 3M of routing inlets.

In one or more embodiments of the present disclosure, the light-emitting unit routing assembly further includes a plurality of ground routings and a bus wire surrounding a peripheral area of the display screen and electrically connected to the ground routings. The display screen has 3M of routing inlets located at the first side. The 3M of routing inlets are configured to accommodate the first routings, the second routings, and the ground routings.

In one or more embodiments of the present disclosure, the first routings, the second routings, and the ground routings are alternately arranged at an end of the display screen close to the 3M of routing inlets.

In one or more embodiments of the present disclosure, signals of the bus wire and the ground routings are VSS signals.

In order to achieve the above objective, in accordance with an embodiment of the present disclosure, a routing structure of a display screen includes a display screen, a circuit board, a plurality of driver chips, a plurality of first light-emitting units, a plurality of second light-emitting units, and a light-emitting unit routing assembly. The circuit board is located at the first side of the display screen. The driver chips are connected to the circuit board and disposed at the first side of the display screen. The first light-emitting units are disposed on opposite sides of the display screen. The opposite sides of the display screen are respectively connected to the first side. The second light-emitting units are disposed at a second side opposite to the first side of the display screen. The light-emitting unit routing assembly is connected to the driver chips. The light-emitting unit routing assembly includes a plurality of first routings and a plurality of second routings. The first routings are connected between at least one of the driver chips and the first light-emitting units. A difference between a total length of one of the first routings and a total length of another one of the first routings is less than or equal to 2%. The second routings are connected between at least one of the driver chips and the second light-emitting units. A length of the first routings is similar to a length of the second routings. The first routings are divided into a plurality of first light-emitting unit routings and a plurality of second light-emitting unit routings. Each of the first light-emitting unit routings includes a first longitudinal routing segment and a first lateral routing segment. Each of the second light-emitting unit routings includes a second longitudinal routing segment and a second lateral routing segment. The first longitudinal routing segment and the second longitudinal routing segment are extended in a direction from the first side to the second side. The first lateral routing segment and the second lateral routing segment are extended in a direction from a side of the opposite sides of the display screen to the other side of the opposite sides of the display screen.

In one or more embodiments of the present disclosure, the first longitudinal routing segment and the second longitudinal routing segment are on the same layer.

In one or more embodiments of the present disclosure, the first lateral routing segment and the second lateral routing segment are on the same layer.

In one or more embodiments of the present disclosure, the first longitudinal routing segment and the first lateral routing segment are in different layers.

In one or more embodiments of the present disclosure, the second longitudinal routing segment and the second lateral routing segment are in different layers.

In one or more embodiments of the present disclosure, the first longitudinal routing segment is connected to the first lateral routing segment by a via, and the second longitudinal routing segment is connected to the second lateral routing segment by another via.

In one or more embodiments of the present disclosure, the routing structure of the display screen further includes a display screen routing separated from the light-emitting unit routing assembly. The first lateral routing segment and the second lateral routing segment have a width. The first longitudinal routing segment and the second longitudinal routing segment have a width. The width of the first lateral routing segment and the second lateral routing segment and the width of the first longitudinal routing segment and the second longitudinal routing segment are less than a width of the display screen routing.

In one or more embodiments of the present disclosure, a lateral length of one of the first routings parallel to an extending direction of the first side or the second side is X1. A longitudinal length of the one of the first routings parallel to a direction from the first side to the second side is Y1. A lateral length of another one of the first routings parallel to the extending direction of the first side or the second side is X2. A longitudinal length of the another one of the first routings parallel to the direction from the first side to the second side is Y2. X1 is greater than Y1, and X2 is less than Y2.

In summary, in the routing structure of the display screen of the present disclosure, since the length of the first routings is the same as the length of the second routings, the resistance of the first routings is equal to that of the second routings, so that the brightness of each of the light-emitting units located in the peripheral area of the display screen is the same. In the routing structure of the display screen of the present disclosure, since two ends of the first routings are respectively connected to the driver chips close to the opposite sides of the display screen and the light-emitting units far away from the first side of the display screen, and two ends of the another one of the first routings are respectively connected to the driver chips far away from the opposite sides of the display screen and the light-emitting units close to the first side of the display screen, the length of each of the first routings being the same can be achieved. Accordingly, the routing structure of the display screen of the present disclosure can solve the problem that the light-emitting unit cannot emit light uniformly.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 7 is a cross-sectional view of the first routings along a section A-A' of FIG. 6 in accordance with an embodiment of the present disclosure;

FIG. 8 is a cross-sectional view of the first routings along a section B-B' of FIG. 6 in accordance with an embodiment of the present disclosure;

FIG. 9 is a cross-sectional view of the first routings along a section C-C' of FIG. 6 in accordance with an embodiment of the present disclosure;

FIG. 13 is a perspective view of the second configuration of the routing structure of the display screen in accordance with an embodiment of the present disclosure;

DETAILED DESCRIPTION

Figure 1:
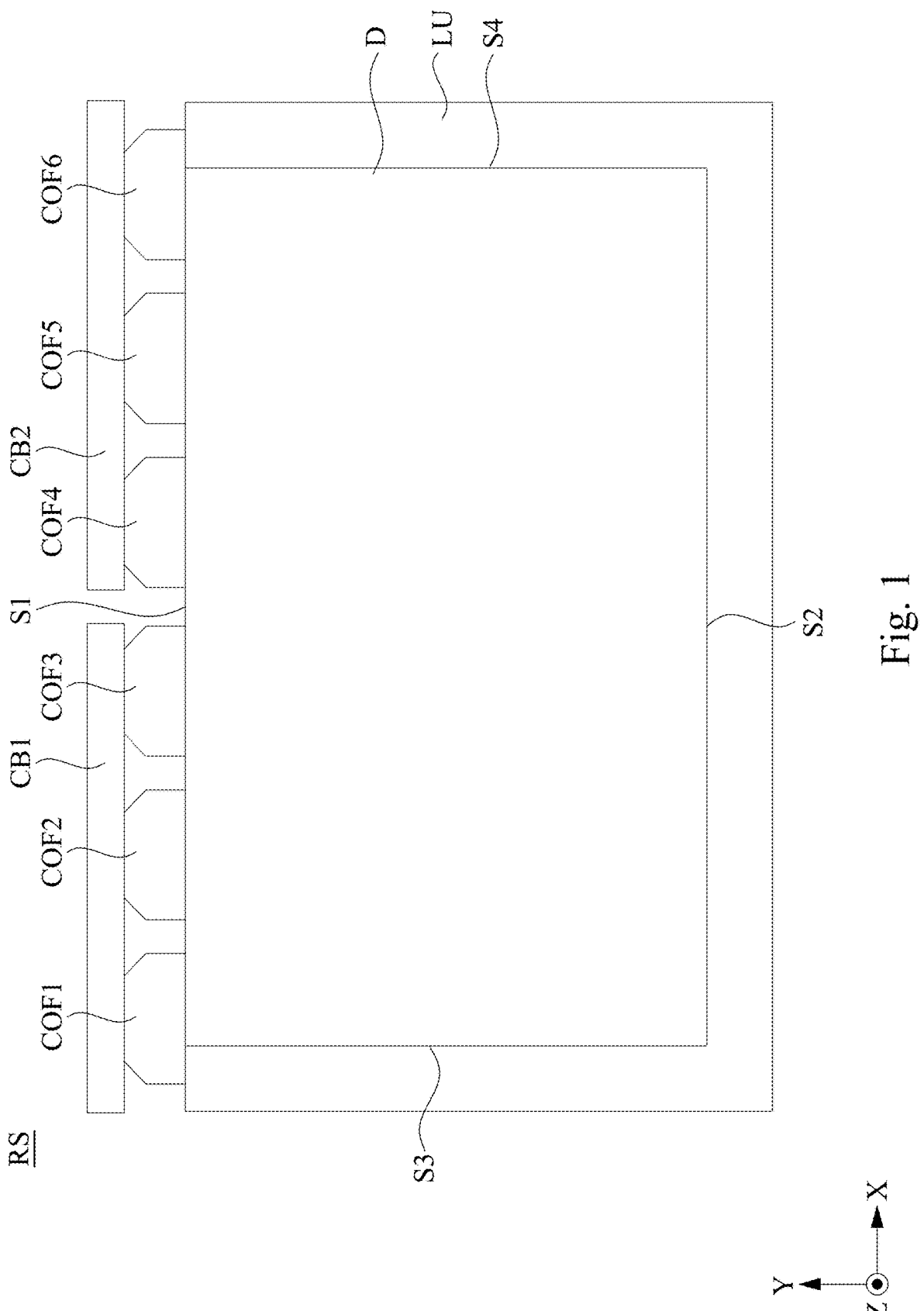
FIG. 1 is a top view of a routing structure of a display screen in accordance with an embodiment of the present disclosure.

A plurality of embodiments of the present disclosure will be disclosed in figures below. For clarity, many practical details will be explained in the following description. However, it should be understood that these practical details should not be utilized to limit the disclosure. That is to say, in some embodiments of the present disclosure, these practical details are not necessary. In addition, for the sake of simplifying the drawings, some commonly used structures and components will be illustrated in a simple schematic manner in the drawings. The same reference numbers will be used throughout the drawings to refer to the same or similar elements.

In the drawings, the thickness of layers, films, panels, regions, etc., are exaggerated for clarity. Throughout this specification, the same drawing numbers refer to the same elements. It will be understood that when an element such as a layer, film, region or substrate is referred to as being "on" or "connected to" another element, it can be directly on or connected to the other element, or an intermediate elements may also exist. In contrast, when an element is referred to as being "directly on" or "directly connected to" another element, there are no intermediate elements exist. As used herein, "connected" may refer to physically and/or electrically connected. Furthermore, "electrically connected" or "coupled" may mean the presence of other components between the two components.

It will be understood that, although the terms "first," "second," "third," etc. may be used herein to describe various elements, components, regions, layers and/or portions shall not be limited by these terms. These terms are only used to distinguish one element, component, region, layer or portion from another element, component, region, layer or portion. Thus, a "first element", "component", "region", "layer", or "portion" discussed below could be termed a second element, component, region, layer or portion without departing from the teachings herein.

The terminology used herein is for the purpose of describing particular embodiments only and is not intended to be limiting. As used herein, the singular forms "a/an", "one", and "the" are intended to include the plural forms including "at least one" unless the content clearly dictates otherwise. "Or" means "and/or". As used herein, the term "and/or" includes one or more of the associated listed items, any of them, and all combinations thereof. It will also be understood that when used in this specification, the terms "comprising" and/or "including" designate the presence of stated features, regions, integers, steps, operations, elements, and/or components but do not exclude presence or addition of one or more other features, regions, steps, operations, elements, components, and/or combinations thereof.

Additionally, relative terms, such as "below" or "bottom" and "above" or "top" may be used herein to describe one element's relationship to another element as illustrated in the Figures. It will be understood that relative terms are intended to include different orientations of the device in addition to the orientation illustrated in the figures. For example, if the device in one of the figures is turned over, elements described as "below" other elements would then be oriented "above" the other elements. Thus, the exemplary term "below" may include both "below" and "above" orientations, depending on the particular orientation of the drawing. Similarly, if the device in one of the figures is turned over, elements described as "below" or "beneath" other elements would then be oriented "over" the other elements. Thus, the exemplary terms "below" or "beneath" may include both over and under orientations.

As used herein, "about," "approximately," or "substantially" includes the stated value and an average within an acceptable range of deviations from the particular value as determined by one of ordinary skill in the art, considering a specific amount of the measurement and error related to the measurement (i.e., the limitations of the measurement system). For example, "about" may mean within one or more standard deviations of the stated value, or within ±30%, ±20%, ±10%, ±5%. Furthermore, the terms "about", "approximately", or "substantially" used herein can be used to select a more acceptable deviation range or standard deviation based on optical properties, etching properties, or other properties, and one standard deviation does not apply to all properties.

Unless otherwise defined, all terms (including technical and scientific terms) used herein have the same meaning as commonly understood by one of ordinary skill in the art to which this invention belongs. It will be further understood that terms such as those defined in commonly used dictionaries should be construed to have meanings consistent with their meanings in the context of the relevant technology and the present invention, and are not to be construed as idealistic or excessively formal meaning, unless expressly defined herein.

Reference is made to FIG. 1. FIG. 1 is a top view of a routing structure of a display screen RS in accordance with an embodiment of the present disclosure. As shown in FIG. 1, in this embodiment, the routing structure of the display screen RS includes a display screen D, a circuit board CB1, a circuit board CB2, a driver chip COF1, a driver chip COF2, a driver chip COF3, a driver chip COF4, a driver chip COF5, a driver chip COF6, and a light-emitting unit area LU. The display screen D has a first side S1, a second side S2, a third side S3, and a fourth side S4. In some embodiments, the first side S1 is the overhead side of the display screen D, the second side S2 is the ground side opposite to the first side S1 of the display screen D, the third side S3 is the left side of the display screen D, and the fourth side S4 is the right side opposite to the third side S3 of the display screen D. In other words, the third side S3 and the fourth side S4 are respectively connected to the first side S1. As shown in FIG. 1, the circuit board CB1 and the circuit board CB2 are located at the first side S1 of the display screen D. The driver chips COF1-COF6 are connected to the circuit board CB1 and the circuit board CB2 and are disposed at the first side S1 of the display screen D. In some embodiments, the driving chips COF1-COF3 are connected to the circuit board CB1, and the driving chips COF4-COF6 are connected to the circuit board CB2.

As shown in FIG. 1, in this embodiment, the routing structure of the display screen RS further includes THE light-emitting unit area LU. The light-emitting unit area LU surrounds the display screen D on three sides. In detail, the light-emitting unit area LU is disposed at the second side S2, the third side S3, and the fourth side S4 of the display screen D. In some embodiments, the light-emitting unit area LU includes a plurality of light-emitting units. Accordingly, the peripheral area of the display screen D has a light source. When the aforementioned display screens D are arranged adjacently to each other and are spliced into an oversized screen, a visually seamless splicing effect can be achieved.

In some embodiments, the driver chips COF1-COF6 are configured to drive the light-emitting units in the light-emitting unit area LU to emit light.

In some embodiments, the first side S1 of the display screen D does not have the light-emitting unit area LU.

In some embodiments, the display screen D may be, for example, a liquid crystal display (LCD) or other similar display.

In some embodiments, as shown in FIG. 1, direction X, direction Y, and direction Z are interlaced with each other.

Figure 2:
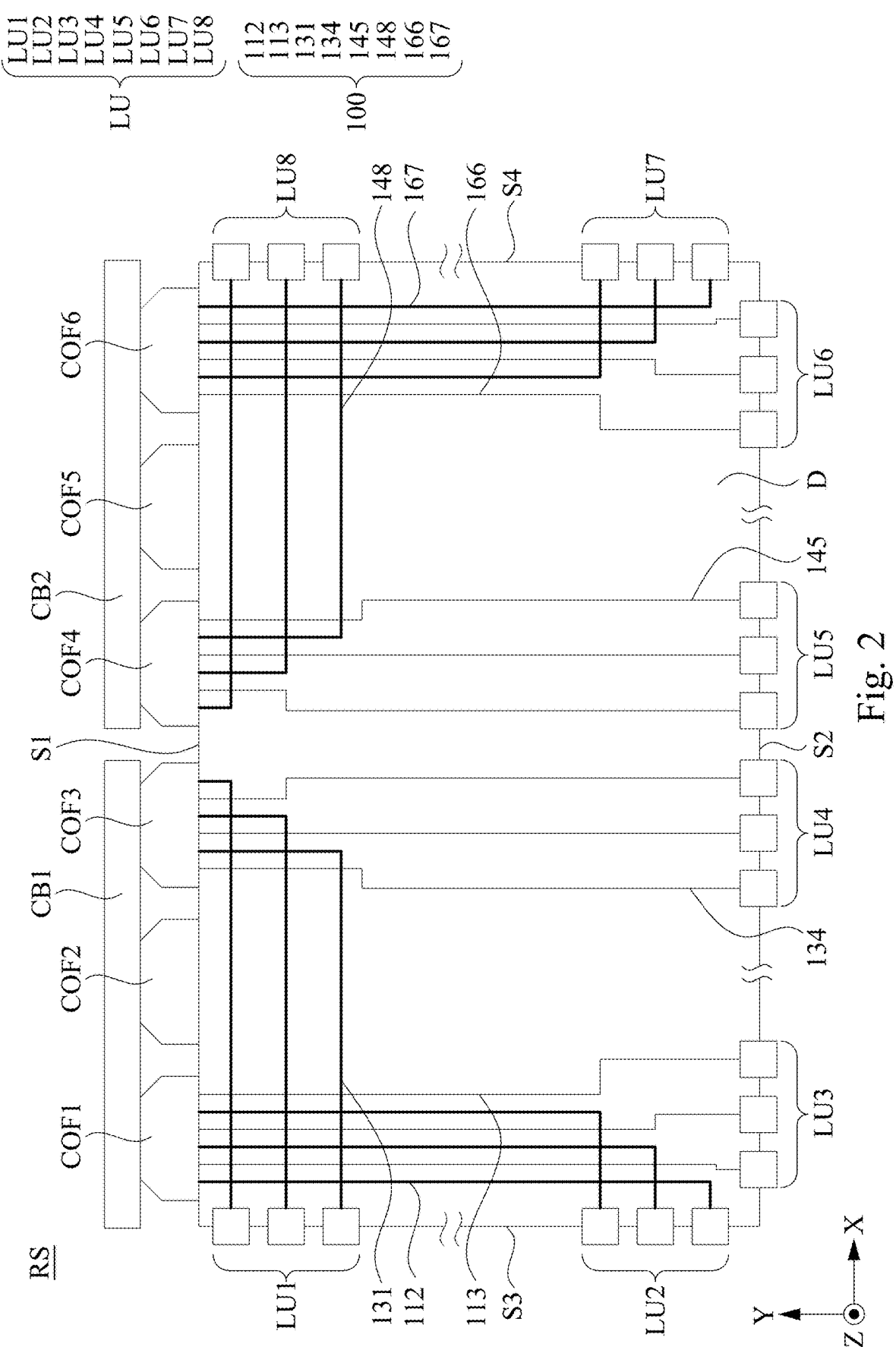
FIG. 2 is a top view of the routing structure of the display screen in accordance with an embodiment of the present disclosure.

Reference is made to FIG. 2. FIG. 2 is a top view of the routing structure of the display screen RS in accordance with an embodiment of the present disclosure. FIG. 2 depicts a more detailed structural configuration of the routing structure of the display screen RS compared to FIG. 1. As shown in FIG. 2, in this embodiment, the routing structure of the display screen RS further includes a light-emitting unit routing assembly 100. The light-emitting unit routing assembly 100 is connected between the driver chips COF1-COF6 and the light-emitting unit area LU. Accordingly, the driver chips COF1-COF6 can be connected to the light-emitting unit area LU by the light-emitting unit routing assembly 100 to drive the light-emitting units in the light-emitting unit area LU to emit light.

As shown in FIG. 2, the light-emitting unit area LU further includes a first light-emitting unit LU1, a first light-emitting unit LU2, a first light-emitting unit LU7, a first light-emitting unit LU8, a second light-emitting unit LU3, a second light-emitting unit LU4, a second light-emitting unit LU5, and a second light-emitting unit LU6. Specifically, the first light-emitting unit LU1, the first light-emitting unit LU2, the first light-emitting unit LU7, and the first light-emitting unit LU8 are disposed on opposite sides of the display screen D (i.e., the third side S3 and the fourth side S4 of the display screen D). In some embodiments, the first light-emitting unit LU1 and the first light-emitting unit LU2 are disposed on the third side S3 of the display screen D, and the first light-emitting unit LU7 and the first light-emitting unit LU8 are disposed on the fourth side S4 of the display screen D. In some embodiments, the first light-emitting unit LU1 is located at the third side S3 and close to the first side S1, and the first light-emitting unit LU2 is located at the third side S3 and away from the first side S1. In some embodiments, the first light-emitting unit LU7 is located at the fourth side S4 and away from the first side S1, and the first light-emitting unit LU8 is located at the fourth side S4 and close to the first side S1. Specifically, the second light-emitting unit LU3, the second light-emitting unit LU4, the second light-emitting unit LU5, and the second light-emitting unit LU6 are disposed at the second side S2 of the display screen D (e.g., the ground side of the display screen D). In some embodiments, the second light-emitting unit LU3 and the second light-emitting unit LU4 are disposed at the second side S2 of the display screen D and close to the third side S3, and the second light-emitting unit LU5 and the second light-emitting unit LU6 are disposed at the second side S2 of the display screen D and close to the fourth side S4.

As shown in FIG. 2, the light-emitting unit routing assembly 100 further includes a first routing 112, a first routing 131, a first routing 148, a first routing 167, a second routing 113, a second routing 134, a second routing 145, and a second routing 166. The first routing 112, the first routing 131, the first routing 148, and the first routing 167 are configured to be connected to the light-emitting units located at the sides of the display screen D (e.g., the third side S3 and the fourth side S4). The second routing 113, the second routing 134, the second routing 145, and the second routing 166 are configured to be connected to the light-emitting unit located on the ground side (e.g., the second side S2) of the display screen D. In detail, the first routing 112 is connected between the driver chip COF1 and the first light-emitting unit LU2. The first routing 131 is connected between the driver chip COF3 and the first light-emitting unit LU1. The first routing 148 is connected between the driver chip COF4 and the first light-emitting unit LU8. The first routing 167 is connected between the driver chip COF6 and the first light-emitting unit LU7. The second routing 113 is connected between the driver chip COF1 and the second light-emitting unit LU3. The second routing 134 is connected between the driver chip COF3 and the second light-emitting unit LU4. The second routing 145 is connected between the driver chip COF4 and the second light-emitting unit LU5. The second routing 166 is connected between the driver chip COF6 and the second light-emitting unit LU6.

In some embodiments, the first light-emitting unit LU1, the first light-emitting unit LU2, the first light-emitting unit LU7, the first light-emitting unit LU8, the second light-emitting unit LU3, the second light-emitting unit LU4, the second light-emitting unit LU5, and the second light-emitting unit LU6 may be, for example, a micro light-emitting diode (Micro LED) or other suitable light-emitting unit. The present disclosure is not intended to limit the type of the first light-emitting unit LU1, the first light-emitting unit LU2, the first light-emitting unit LU7, the first light-emitting unit LU8, the second light-emitting unit LU3, the second light-emitting unit LU4, the second light-emitting unit LU5, and the second light-emitting unit LU6.

By the foregoing structural configuration, because the driver chip (e.g., the driver chip COF1 or the driver chip COF6) close to the third side S3 or the fourth side S4 of the display screen D is connected to the first light-emitting unit (e.g., the first light-emitting unit LU2 or the first light-emitting unit LU7) away from the first side S1 by the first routings, and the driver chip (e.g., the driver chip COF3 or the driver chip COF4) away from the third side S3 or the fourth side S4 of the display screen D is connected to the first light-emitting unit (e.g., the first light-emitting unit LU1 or the first light-emitting unit LU8) close to the first side S1 of the display screen D by the first routings, so lengths of the first routings are similar to each other, and the lengths of the first routings and lengths of the second routings are similar. Briefly, as shown in FIG. 2, the aforementioned first routings follow the principles of "long longitudinally with short horizontally" and "short longitudinally with long horizontally", so that the lengths of the first routings are similar. Since the length of the routing is positively correlated with the resistance of the routing, the resistance of each of the first routings is similar to the resistance of each of the second routings, so that the effect of each of the light-emitting units uniformly emitting light can be achieved.

For instance, a lateral length of one of the first routings parallel to an extending direction (e.g., direction X) of the first side S1 or the second side S2 is X1, and a longitudinal length of one of the first routings parallel to a direction (e.g., direction Y) from the first side S1 to the second side S2 is Y1. A lateral length of another one of the first routings parallel to the extending direction (e.g., direction X) of the first side S1 or the second side S2 is X2, and a longitudinal length of the another one of the first routings parallel to a direction (e.g., direction Y) from the first side S1 to the second side S2 is Y2. In some embodiments, X1 is greater than Y1, and X2 is less than Y2.

In some embodiments, a difference between a total length of one of the first routings and a total length of another one of the first routings is less than or equal to about 2%. In other words, a difference between a sum of X1 and Y1 and a sum of X2 and Y2 is less than or equal to about 2%.

In some embodiments, the lengths of the first routings are the same. In some embodiments, the length of each of the first routings and the length of each of the second routings are the same. Therefore, the resistance of each of the first routings is the same, and the resistance of each of the first routings and the resistance of each of the second routings are also the same.

Figure 3:
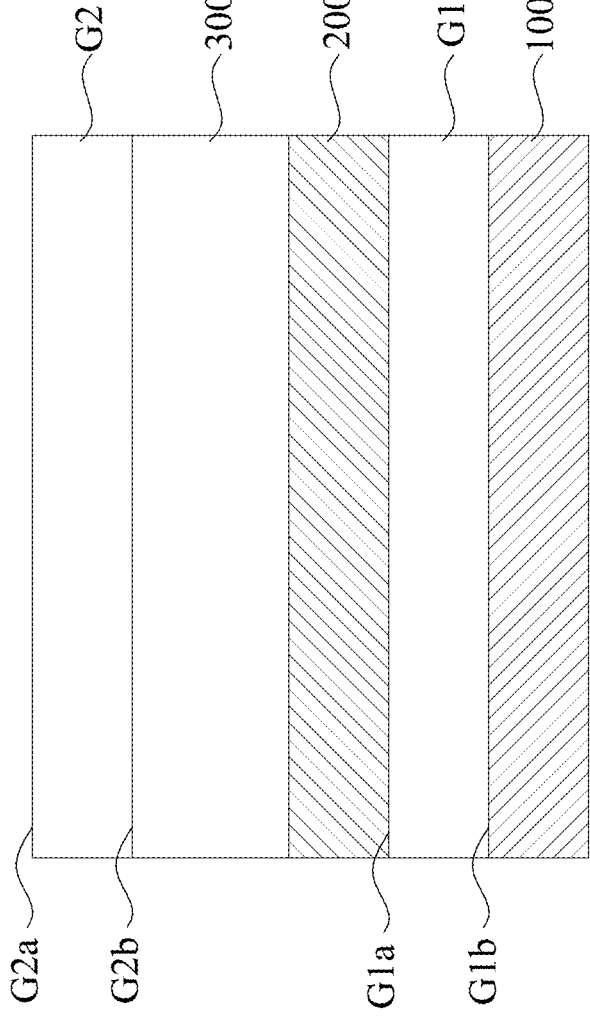
FIG. 3 is a cross-sectional view of the routing structure of the display screen in accordance with an embodiment of the present disclosure.

Reference is made to FIG. 3. FIG. 3 is a cross-sectional view of the routing structure of the display screen RS in accordance with an embodiment of the present disclosure. As shown in FIG. 3, in this embodiment, the routing structure of the display screen RS further includes a first substrate G1, a second substrate G2, a display screen routing 200, and a liquid crystal layer 300. Specifically, the display screen routing 200 is configured as a routing of a backlight module (not shown) of the display screen D. In some embodiments, the light-emitting unit routing assembly 100 and the display screen routing 200 are in different layers. As shown in FIG. 3, the second substrate G2 is disposed over the first substrate G1. The liquid crystal layer 300 is located between the first substrate G1 and the second substrate G2. In some embodiments, the display screen routing 200 is disposed at a side of the first substrate G1, and the light-emitting unit routing assembly 100 is disposed at the other side of the first substrate G1. In some embodiments, the first substrate G1 has an upper surface G1a and a lower surface G1b. The second substrate G2 has an upper surface G2a and a lower surface G2b. In some embodiments, the display screen routings 200 are disposed on the upper surface G1a of the first substrate G1, and the light-emitting unit routing assembly 100 is disposed on the lower surface G1b of the first substrate G1.

In some embodiments, the liquid crystal layer 300 is disposed over the display screen routing 200.

In some embodiments, the first substrate G1 and the second substrate G2 may be, for example, glass substrates or other suitable materials.

Figure 4:
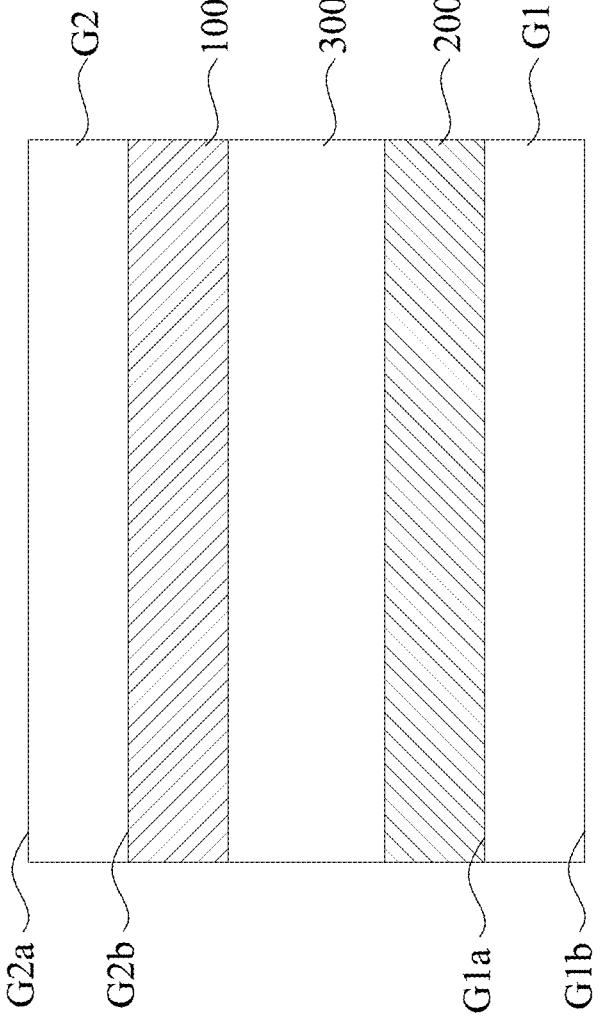
FIG. 4 is a cross-sectional view of the routing structure of the display screen in accordance with another embodiment of the present disclosure.

Reference is made to FIG. 4. FIG. 4 is a cross-sectional view of the routing structure of the display screen RS in accordance with another embodiment of the present disclosure. The structural configuration of the routing structure of the display screen RS in FIG. 4 is similar to the structural configuration of the routing structure of the display screen RS in FIG. 3. The difference in between is that the display screen routing 200 and the light-emitting unit routing assembly 100 are respectively disposed on different sides of different substrates as shown in FIG. 4. In some embodiments, the display screen routing 200 is disposed on the first substrate G1, and the light-emitting unit routing assembly 100 is disposed on the second substrate G2. As shown in FIG. 4, in some embodiments, the display screen routing 200 is disposed on the upper surface G1a of the first substrate G1, and the light-emitting unit routing assembly 100 is disposed on the lower surface G2b of the second substrate G2.

In some other embodiments, the display screen routing 200 is disposed on the lower surface G1b of the first substrate G1, and the light-emitting unit routing assembly 100 is disposed on the upper surface G2a of the second substrate G2.

Figure 5:
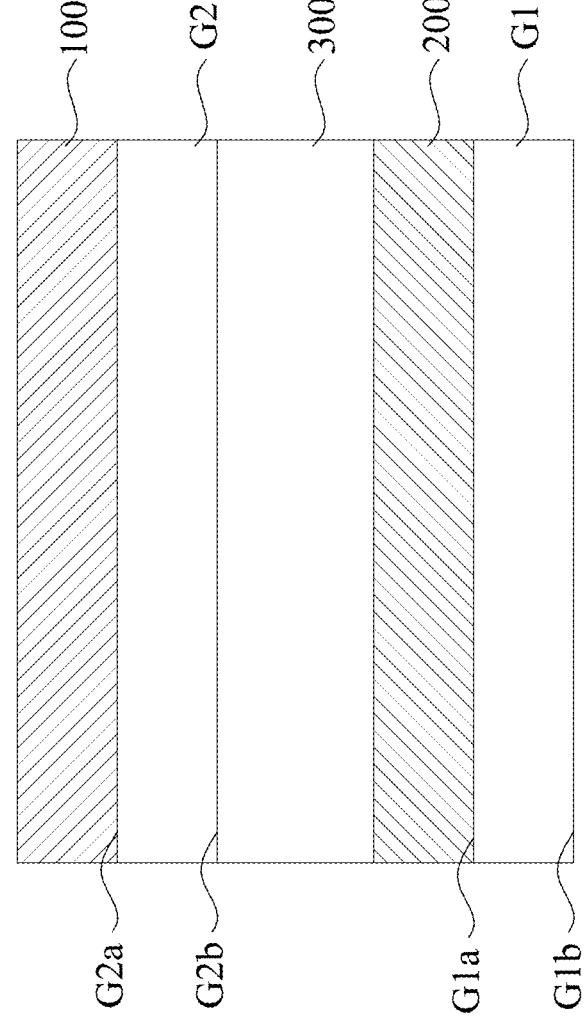
FIG. 5 is a cross-sectional view of the routing structure of the display screen in accordance with yet another embodiment of the present disclosure.

Reference is made to FIG. 5. FIG. 5 is a cross-sectional view of the routing structure of the display screen RS in accordance with yet another embodiment of the present disclosure. The structural configuration of the routing structure of the display screen RS in FIG. 5 is similar to the structural configuration of the routing structure of the display screen RS in FIG. 4. The difference in between is that the display screen routing 200 and the light-emitting unit routing assembly 100 are respectively disposed on the same side of different substrates in FIG. 5. As shown in FIG. 5, in some embodiments, the display screen routing 200 is disposed on the upper surface G1a of the first substrate G1, and the light-emitting unit routing assembly 100 is disposed on the upper surface G2a of the second substrate G2.

In some other embodiments, the display screen routing 200 is disposed on the lower surface G1b of the first substrate G1, and the light-emitting unit routing assembly 100 is disposed on the lower surface G2b of the second substrate G2.

Figure 6:
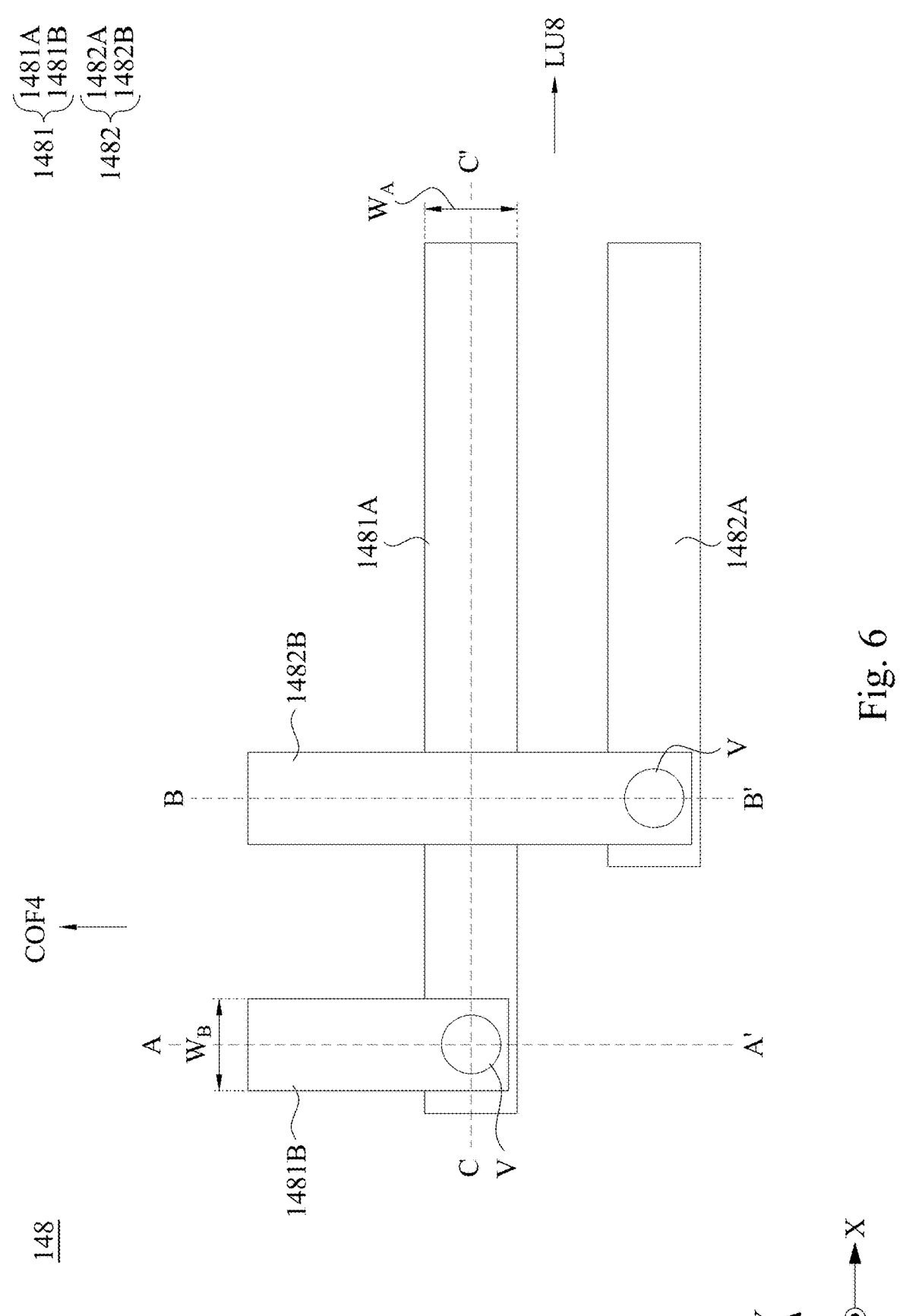
FIG. 6 is a top view of first routings in accordance with an embodiment of the present disclosure.

Reference is made to FIG. 6. FIG. 6 is a top view of first routings 148 in accordance with an embodiment of the present disclosure. In this embodiment, the first routings of the present disclosure are divided into first light-emitting unit routings and second light-emitting unit routings. Each of the first light-emitting unit routings further includes a first longitudinal routing segment and a first lateral routing segment, and each of the second light-emitting unit routings further includes a second longitudinal routing segment and a second lateral routing segment. For simplicity, the following takes the first routings 148 as an example. As shown in FIG. 6, in this embodiment, the first routings 148 are divided into first light-emitting unit routings 1481 and second light-emitting unit routings 1482. Each of the first light-emitting unit routings 1481 further includes a first lateral routing segment 1481A and a first longitudinal routing segment 1481B, and each of the second light-emitting unit routings 1482 further includes a second lateral routing segment 1482A and a second longitudinal routing segment 1482B. As shown in FIG. 6, in some embodiments, the first longitudinal routing segment 1481B and the second longitudinal routing segment 1482B are extended in a direction (e.g., direction Y) from the first side S1 to the second side S2. In some embodiments, the first lateral routing segment 1481A and the second lateral routing segment 1482A are extended in a direction (e.g., direction X) from one of the opposite sides of the display screen D (e.g., the third side S3) to the other one of the opposite sides of the display screen D (e.g., the fourth side S4).

As shown in FIG. 6, in this embodiment, the first longitudinal routing segment 1481B is connected to the first lateral routing segment 1481A by a via V, and the second longitudinal routing segment 1482B is connected to the second lateral routing segment 1482A by another via V.

As shown in FIG. 6, in some embodiments, the first lateral routing segment 1481A and the second lateral routing segment 1482A have a width WA extending along a direction (e.g., direction Y) from the first side S1 to the second side S2. In some embodiments, the first longitudinal routing segment 1481B and the second longitudinal routing segment 1482B have a width WB extending along a direction (e.g., direction X) from the third side S3 to the fourth side S4. In some embodiments, the width WA of the first lateral routing segment 1481A and the second lateral routing segment 1482A is about 10.7 microns. In some embodiments, the width WB of the first longitudinal routing segment 1481B and the second longitudinal routing segment 1482B is about 12 microns. However, the present disclosure is not intended to limit the size of the width WA and the width WB.

In some embodiments, the width WA of the first lateral routing segment 1481A and the second lateral routing segment 1482A and the width WB of the first longitudinal routing segment 1481B and the second longitudinal routing segment 1482B are less than a width of the display screen routing 200.

Reference is made to FIG. 7. FIG. 7 is a cross-sectional view of the first routings 148 along a section A-A' of FIG. 6 in accordance with an embodiment of the present disclosure. As shown in FIG. 7, the routing structure of the display screen RS further includes a passivation layer PL. The passivation layer PL covers the first lateral routing segment 1481A. The first longitudinal routing segment 1481B is disposed on the passivation layer PL. In some embodiments, the first longitudinal routing segment 1481B and the first lateral routing segment 1481A are in different layers. The via V runs through the passivation layer PL, and two ends of the via V are respectively connected to the first lateral routing segment 1481A and the first longitudinal routing segment 1481B. As shown in FIG. 7, the first lateral routing segment 1481A is electrically connected to the first longitudinal routing segment 1481B by the via V, such that the signal from the driver chip COF4 can be transmitted to the first light-emitting unit LU8 by the first light-emitting unit routings 1481.

Reference is made to FIG. 8. FIG. 8 is a cross-sectional view of the first routings 148 along a section B-B' of FIG. 6 in accordance with an embodiment of the present disclosure. The passivation layer PL covers the first lateral routing segment 1481A and the second lateral routing segment 1482A. The second longitudinal routing segment 1482B is disposed on the passivation layer PL. In some embodiments, the second longitudinal routing segment 1482B and the second lateral routing segment 1482A are in different layers. The via V runs through the passivation layer PL, and two ends of the via V are respectively connected to the second lateral routing segment 1482A and the second longitudinal routing segment 1482B. As shown in FIG. 8, the second lateral routing segment 1482A is electrically connected to the second longitudinal routing segment 1482B by the via V, such that the signal from the driver chip COF4 can be transmitted to the first light-emitting unit LU8 by the second light-emitting unit routing 1482.

As shown in FIG. 8, in some embodiments, the first lateral routing segment 1481A and the second lateral routing segment 1482A are on the same layer.

Reference is made to FIG. 9. FIG. 9 is a cross-sectional view of the first routings 148 along a section C-C' of FIG. 6 in accordance with an embodiment of the present disclosure. The passivation layer PL covers the first lateral routing segment 1481A. The first longitudinal routing segment 1481B and the second longitudinal routing segment 1482B are disposed on the passivation layer PL. In some embodiments, the second longitudinal routing segment 1482B and the first lateral routing segment 1481A are in different layers.

As shown in FIG. 9, in some embodiments, the first longitudinal routing segment 1481B and the second longitudinal routing segment 1482B are on the same layer.

Figure 10:
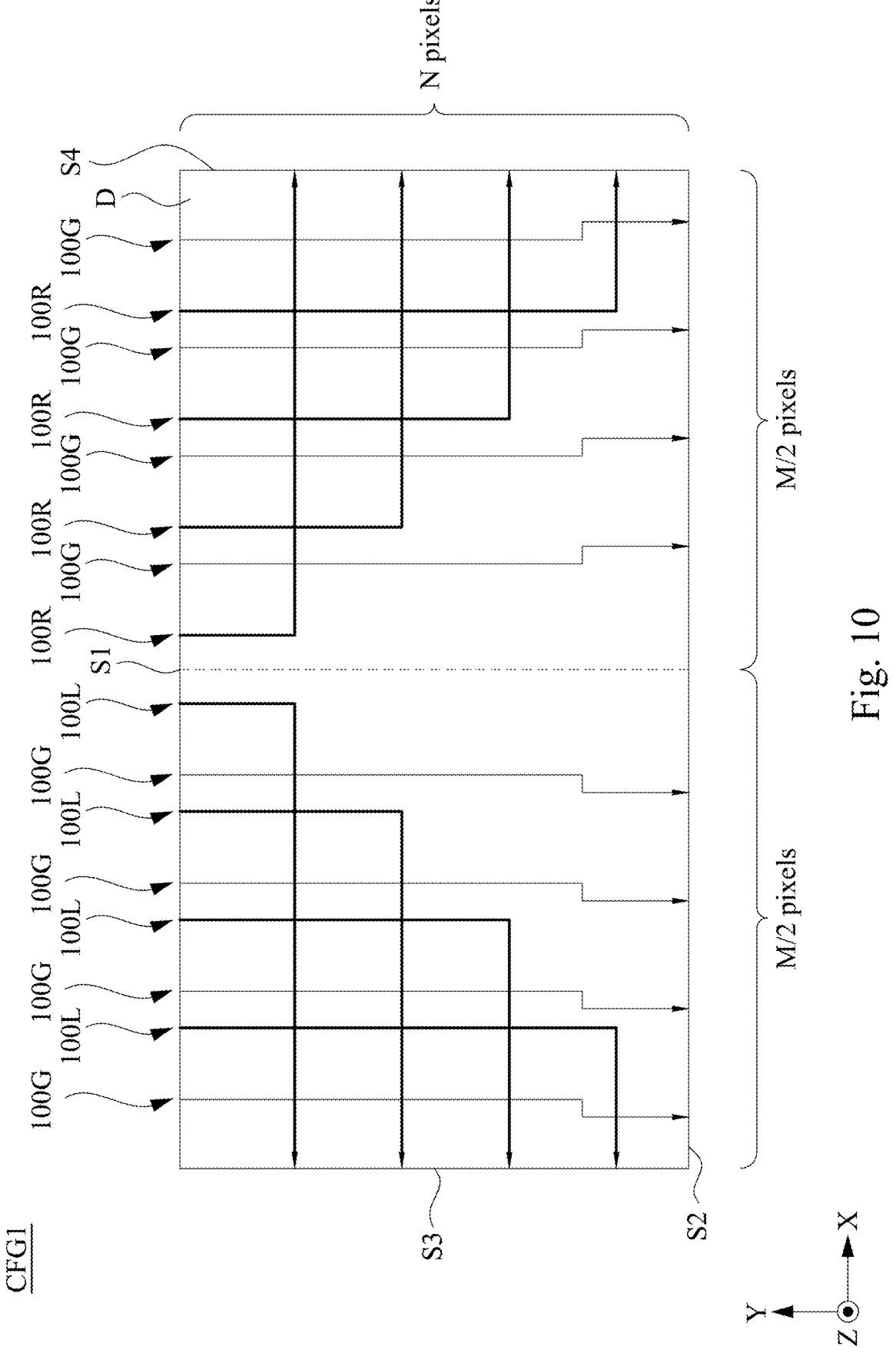
FIG. 10 is a perspective view of a first configuration of the routing structure of the display screen in accordance with an embodiment of the present disclosure.

Reference is made to FIG. 10. FIG. 10 is a perspective view of a first configuration CFG1 of the routing structure of the display screen RS in accordance with an embodiment of the present disclosure. As shown in FIG. 10, in this embodiment, the display screen D is a display with a resolution of M*N. Specifically, the display screen D accommodates M of pixel units in an extending direction (e.g., direction X) of the first side S1 (or the second side S2). The display screen D accommodates N of pixel units in a direction from the first side S1 to the second side S2 (e.g., direction Y). As shown in FIG. 10, a dotted line is depicted in the center of the display screen D. The dotted line divides the display screen D into a left half portion and a right half portion. In other words, each of the left half portion and the right half portion of the display screen D accommodates M/2 of pixels in a lateral direction. For simplicity, the specific structure of the pixel is not shown in FIG. 10. As shown in FIG. 10, in this embodiment, the light-emitting unit routing assembly 100 includes a plurality of first routings 100L, a plurality of first routings 100R, and a plurality of second routings 100G. Two ends of each of the first routings 100L are connected to the first side S1 and the third side S3 of the display screen D, respectively. Two ends of each of the first routings 100R are connected to the first side S1 and the fourth side S4 of the display screen D, respectively. Two ends of each of the second routings 100G are connected to the first side S1 and the second side S2 of the display screen D, respectively. As shown in FIG. 10, in the first configuration CFG1 of the routing structure of the display screen RS of the present disclosure, the first routings 100L and the second routings 100G are arranged in an alternating manner, and the first routings 100R and the second routings 100G are also arranged in an alternating manner.

Figure 11:
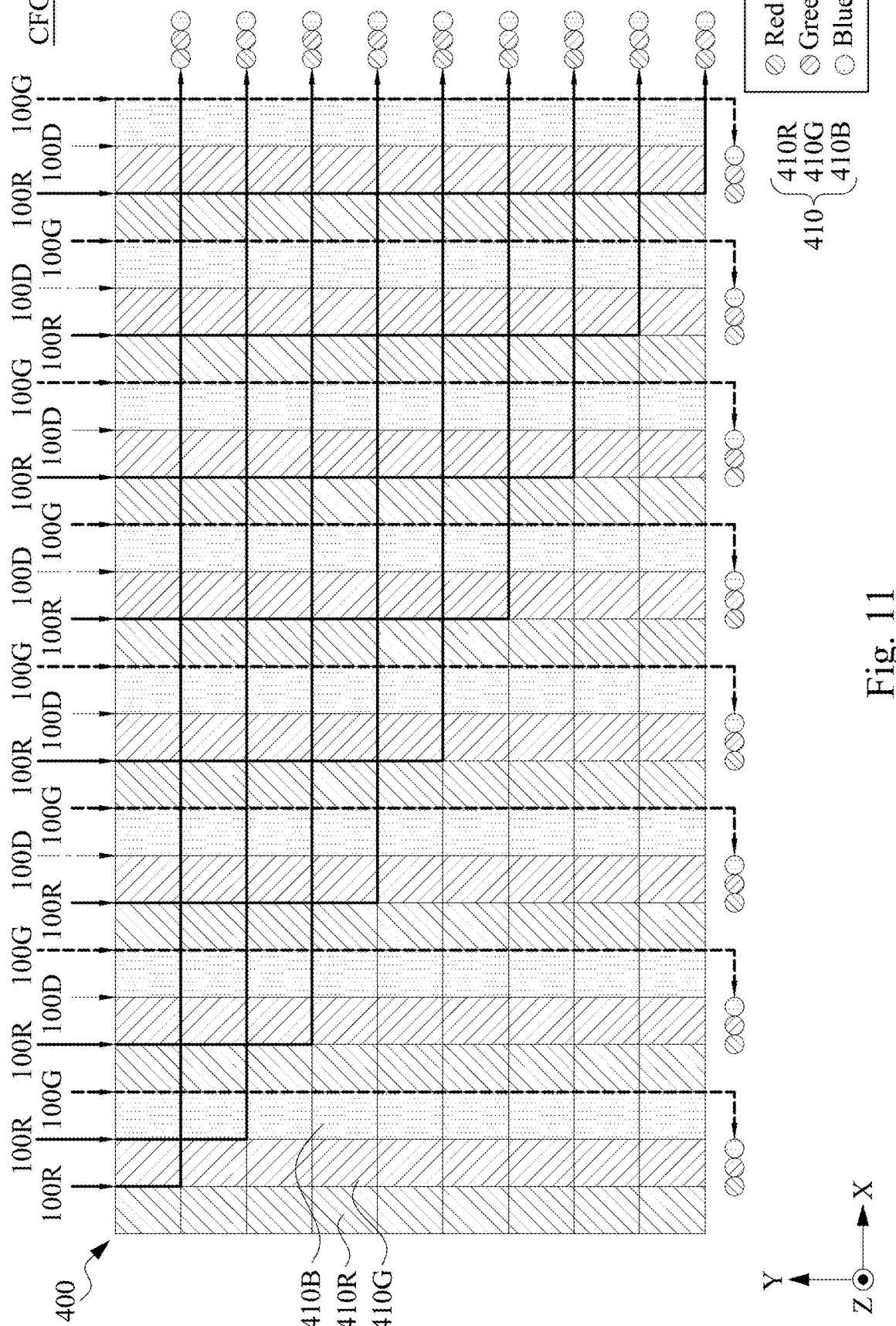
FIG. 11 is a perspective view of the first configuration of the routing structure of the display screen in accordance with an embodiment of the present disclosure.

Reference is made to FIG. 11. FIG. 11 is a perspective view of the first configuration CFG1 of the routing structure of the display screen RS in accordance with an embodiment of the present disclosure. FIG. 11 depicts a more detailed structural configuration compared to the first configuration CFG1 of FIG. 10. For simplicity, FIG. 11 only shows the right half portion of the display screen D. Since the structural configuration of the left half portion of the display screen D is substantially the same as the structural configuration of the right half portion of the display screen D, the details thereof will not be described again herein. As shown in FIG. 11, in this embodiment, the display screen D further includes a pixel array 400. The pixel array 400 is composed of a plurality of pixel units 410. In some embodiments, each of the pixel units 410 further includes a plurality of sub-pixel units. For example, each of the pixel units 410 further includes a red sub-pixel unit 410R, a green sub-pixel unit 410G, and a blue sub-pixel unit 410B. Specifically, as shown in FIGS. 10 and 11, the display screen D accommodates 3M of sub-pixel units in the extending direction (e.g., direction X) of the first side S1 (or the second side S2). The display screen D accommodates N of sub-pixel units in the direction from the first side S1 to the second side S2 (e.g., direction Y).

Reference is made again to FIG. 11. As shown in FIG. 11, in this embodiment, the light-emitting unit routing assembly 100 further includes dummy routings 100D. Specifically, since the display screen D can accommodate 3M of sub-pixel units in the direction X, there are 3M of routing inlets on the first side S1 of the display screen D. In some embodiments, each of the routing inlets can accommodate a first routing 100L, a first routing 100R, a second routing 100G, or a dummy routing 100D. As shown in FIG. 11, in some embodiments, the first routing 100L, the first routing 100R, the second routing 100G, and the dummy routing 100D are arranged alternately at an end of the display screen D close to the aforementioned 3M of routing inlets.

As shown in FIG. 11, in this embodiment, according to the first configuration CFG1 of the routing structure of the display screen RS disclosed in the present disclosure, it can be calculated that the first routing 100L, the first routing 100R, the second routing 100G, and the dummy routing 100D. In the first configuration CFG1 of the routing structure of the display screen RS of the present disclosure, for example, assuming that the required screen resolution is M*N. Without damaging the aperture ratio of the display screen routing 200, the first side S1 of the display screen D has 3M of routing inlets for the first routing 100L, the first routing 100R, the second routing 100G, and the dummy routing 100D. In a case that the signals on each of the first routings 100L, the first routings 100R, and the second routings 100G are all three-in-one signals (that is, each of the routings simultaneously contains three basic colors of light (for example, red, green, and blue)), the total number of the first routings 100L, the first routings 100R, and the second routings 100G used to light up the light-emitting units in the light-emitting unit area LU is M+2N. In detail, the second side S2 needs to be connected to M of the second routings 100G, the third side S3 needs to be connected to N of the first routings 100L, and the fourth side S4 needs to be connected to N of the first routings 100R. Next, subtract the required total number of the first routings 100L, the first routings 100R, and the second routings 100G (i.e., M+2N) from the number of routing inlets (i.e., 3M), and the number of the dummy routings 100D can be obtained.

A practical embodiment is listed below for explanation. If the required screen resolution is 1920*1080 (i.e., a display model with an aspect ratio of 16:9), the first side S1 of the display screen D has 5760 of routing inlets for the first routings 100L, the first routings 100R, the second routings 100G, and the dummy routings 100D without damaging the aperture ratio of the display screen routing 200. For simplicity, FIG. 11 is taken as an example below. Since FIG. 11 only shows the right half portion of the display screen D, the right half portion of the display screen D should include 2880 of routing inlets. The total number of the first routings 100L, the first routings 100R, and the second routings 100G used to light up the light-emitting units in the light-emitting unit area LU is 2040. In detail, the second side S2 needs to be connected to 960 of second routings 100G, and the fourth side S4 needs to be connected to 1080 of first routings 100R. It can be seen that there are a total of 840 routing inlets on the right half portion of the display screen D for the dummy routings 100D. In other words, as shown in FIG. 11, only 17 of every 24 routing inlets are needed for the first routings 100L, the first routings 100R, and the second routings 100G, in which 9 routing inlets are configured for the first routings 100R, and 8 routing inlets are configured for the second routings 100G. The remaining 7 routing inlets are configured for the dummy routings 100D.

As shown in FIG. 11, in some embodiments, the first routings 100L, the first routings 100R, and the second routings 100G are connected within the range of the display screen D in a manner similar to FIG. 2, that is, the first routings 100L, the first routings 100R, and the second routings 100G in the first configuration CFG1 follow the principles of "long longitudinally with short horizontally" and "short longitudinally with long horizontally", so that the lengths of each of the first routings 100L, the first routings 100R, and the second routings 100G are all the same.

Figure 12:
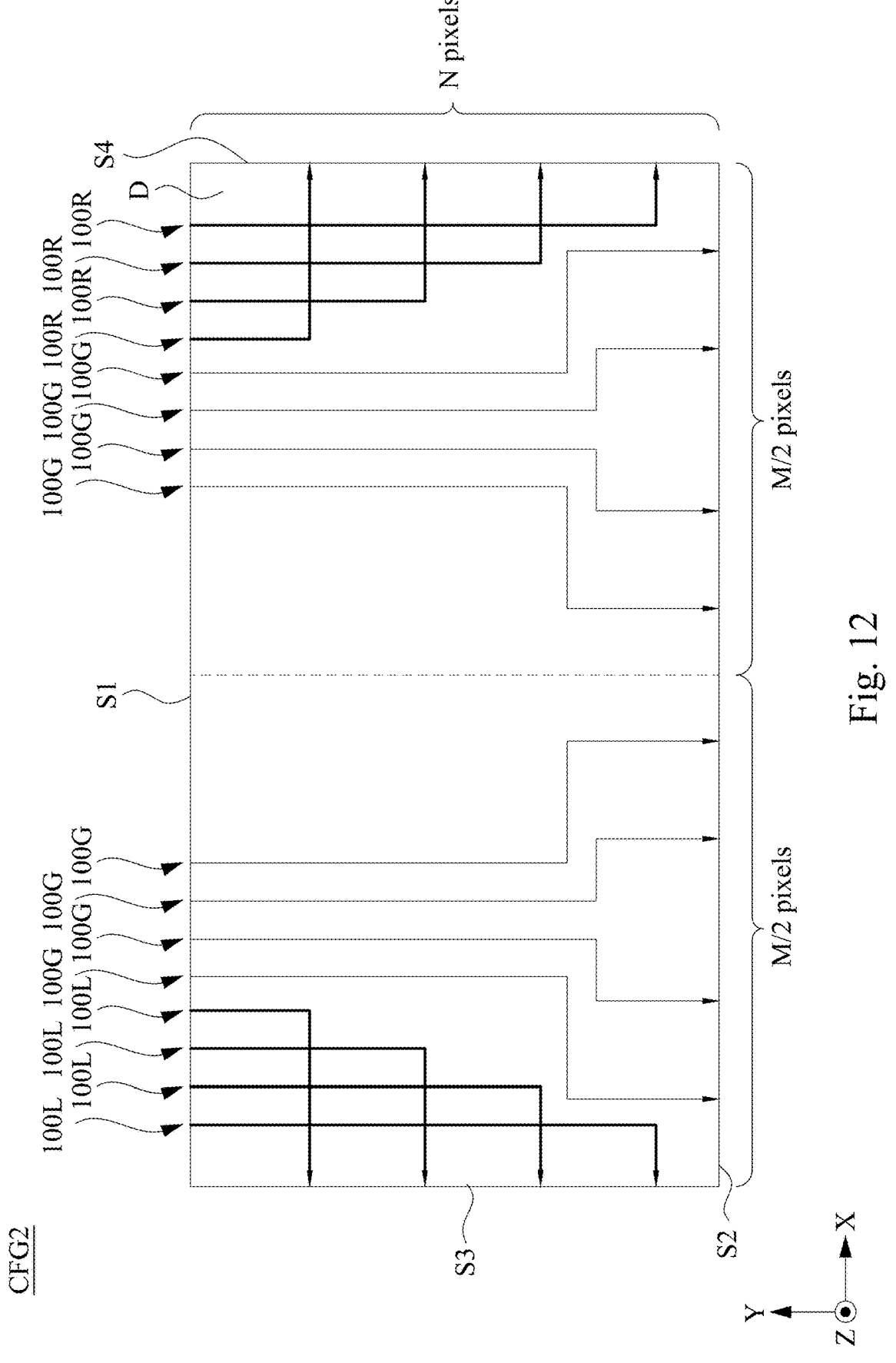
FIG. 12 is a perspective view of a second configuration of the routing structure of the display screen in accordance with an embodiment of the present disclosure.

Reference is made to FIG. 12. FIG. 12 is a perspective view of a second configuration CFG2 of the routing structure of the display screen RS in accordance with an embodiment of the present disclosure. The second configuration CFG2 in FIG. 12 is generally the same as the first configuration CFG1 in FIG. 10. The difference in between is that the first routings 100L, the first routings 100R, and the second routings 100G in FIG. 12 are convergently arranged at an end of the display screen D close to the 3M of routing inlets. Specifically, as shown in FIG. 12, the first routings 100L are convergently arranged on the first side S1 close to the third side S3, and the first routings 100R are convergently arranged on the first side S1 close to the fourth side S4, the second routings 100G are convergently arranged on the first side S1 and enter at the routing inlets that are separated from the routing inlets of the first routings 100L or the first routings 100R.

Figure 13:
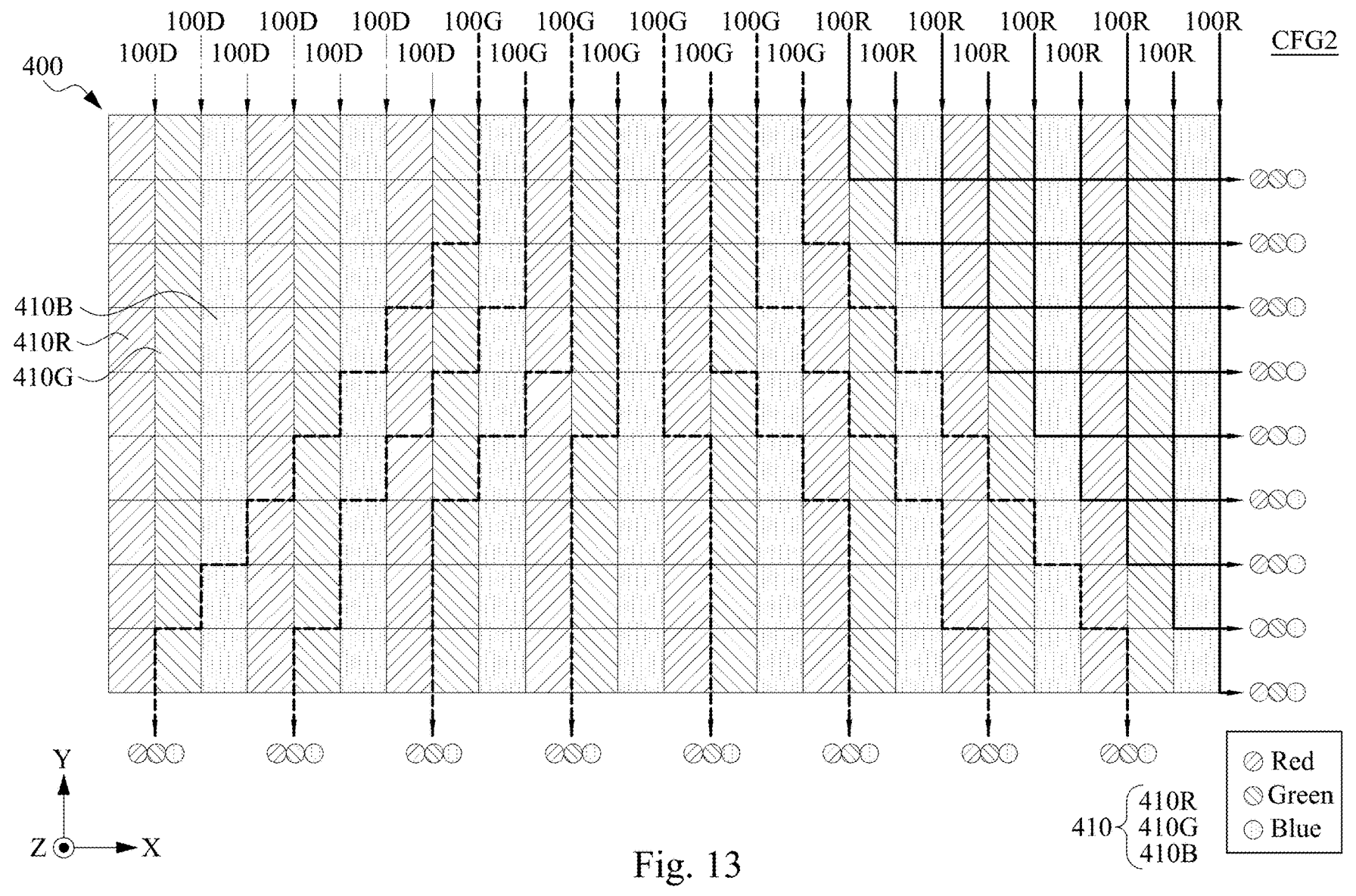

Reference is made to FIG. 13. FIG. 13 is a perspective view of the second configuration CFG2 of the routing structure of the display screen RS in accordance with an embodiment of the present disclosure. Since the calculation of the number of the routing inlets and the number of the routings has been explained in detail above, the details thereof will not be described again herein. The second configuration CFG2 in FIG. 13 is generally similar to the first configuration CFG1 in FIG. 11. The difference in between is that the first routings 100R, the second routings 100G, and the dummy routings 100D are convergently arranged at an end of the 3M of the routing inlets individually. In some embodiments, the first routings 100R enter on the first side S1 close to the fourth side S4. In some embodiments, the dummy routings 100D enter on the first side S1 away from the fourth side S4. In some embodiments, the second routings 100G enter in the center of the first side S1 of the left half portion or the right half portion of the display screen D.

As shown in FIG. 13, in some embodiments, the first routings 100L, the first routings 100R, and the second routings 100G are connected within the range of the display screen D in a manner similar to FIG. 2, that is, the first routings 100L, the first routings 100R, and the second routings 100G in the second configuration CFG2 follow the principles of "long longitudinally with short horizontally" and "short longitudinally with long horizontally", so that the lengths of each of the first routings 100L, the first routings 100R, and the second routings 100G are all the same.

Figure 14:
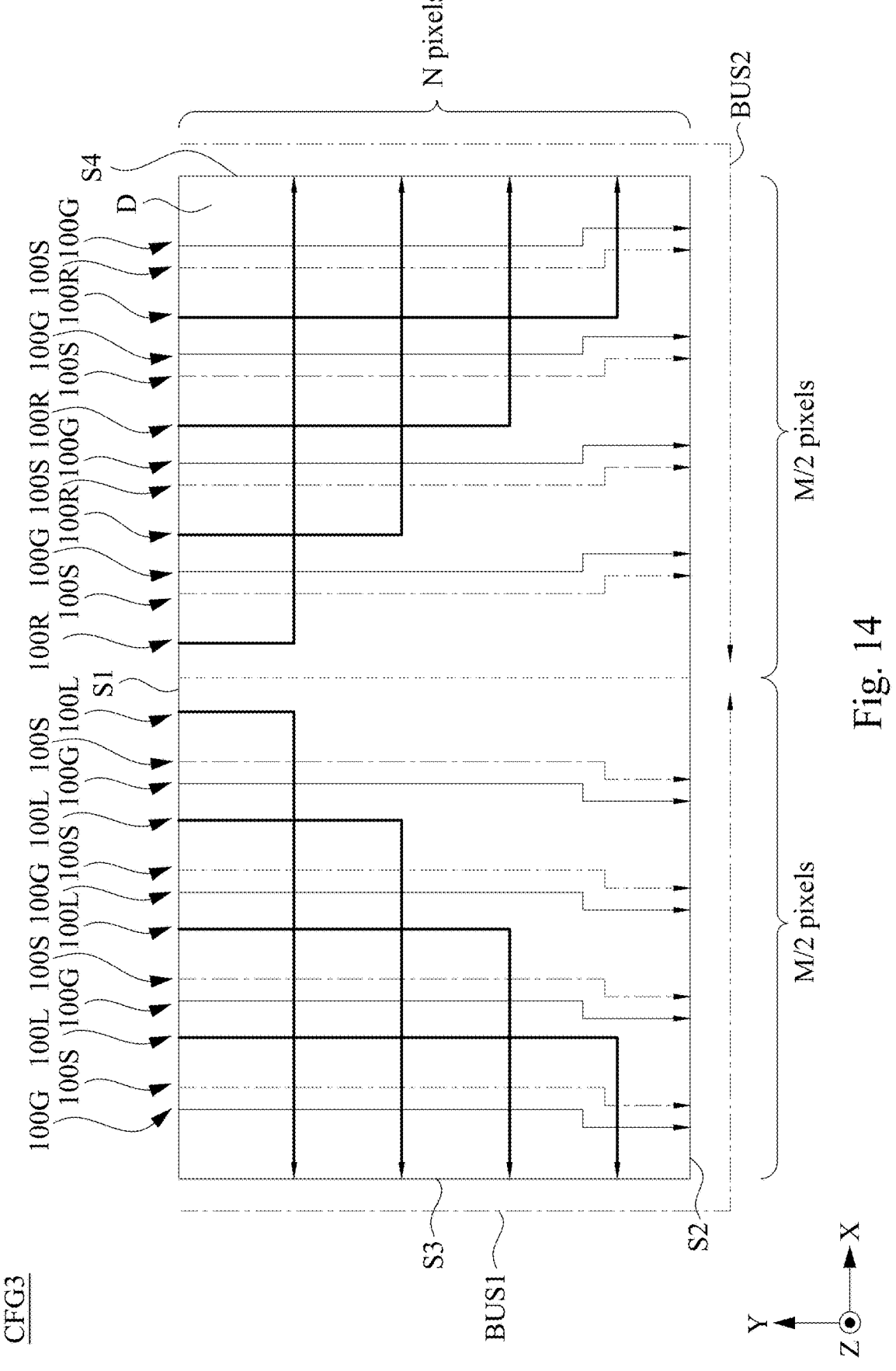
FIG. 14 is a perspective view of a third configuration of the routing structure of the display screen in accordance with an embodiment of the present disclosure.

Reference is made to FIG. 14. FIG. 14 is a perspective view of a third configuration CFG3 of the routing structure of the display screen RS in accordance with an embodiment of the present disclosure. The third configuration CFG3 in FIG. 14 is substantially the same as the first configuration CFG1 in FIG. 10. The difference in between is that the light-emitting unit routing assembly 100 of the third configuration CFG3 in FIG. 14 further includes a plurality of ground routings 100S, a bus wire BUS1, and a bus wire BUS2. Two ends of each of the ground routings 100S are connected to the first side S1 and the second side S2 of the display screen D, respectively. The bus wire BUS1 and the bus wire BUS2 surround the peripheral area of the display screen D. The bus wire BUS1 is extended on the third side S3 and the second side S2 of the left half portion of the display screen D and is configured to be electrically connected to the ground routings 100S. The bus wire BUS2 is extended on the fourth side S4 and the second side S2 of the right half portion of the display screen D and is configured to be electrically connected to the ground routings 100S. In some embodiments, signals of the bus wire BUS1, the bus wire BUS2, and the ground routings 100S are VSS signals. As shown in FIG. 14, in the third configuration CFG3 of the routing structure of the display screen RS of the present disclosure, the first routings 100L, the second routings 100G, and the ground routings 100S are arranged in an alternating manner, and the first routings 100R, the second routings 100G, and the ground routings 100S are also arranged in an alternating manner.

Figure 15:
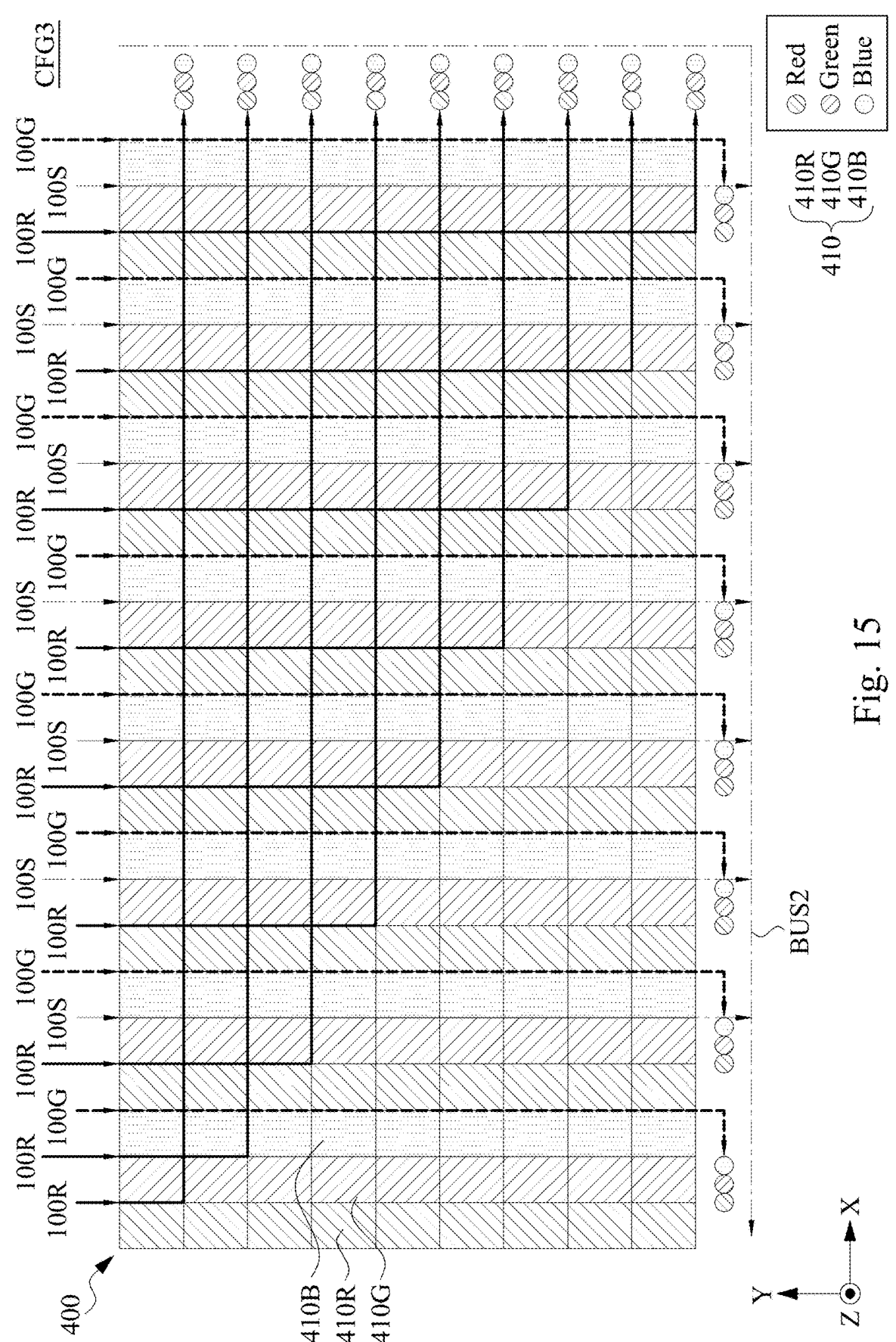
FIG. 15 is a perspective view of the third configuration of the routing structure of the display screen in accordance with an embodiment of the present disclosure.

Reference is made to FIG. 15. FIG. 15 is a perspective view of the third configuration CFG3 of the routing structure of the display screen RS in accordance with an embodiment of the present disclosure. Since the calculation of the number of the routing inlets and the number of the routings has been explained in detail above, the details thereof will not be described again herein. The third configuration CFG3 in FIG. 15 is substantially similar to the first configuration CFG1 in FIG. 11. The difference in between is that the third configuration CFG3 in FIG. 15 further includes ground routings 100S and a bus wire BUS2. As shown in FIG. 15, the ground routings 100S are configured to be electrically connected to the bus wire BUS2 carrying VSS signals, so that the ground routings 100S also carry VSS signals. In this way, not only the resistance of the ground routings 100S can be reduced, but also the extent of coupling of the ground routings 100S induced by the surrounding first routings 100L, the first routings 100R, or the second routings 100G can be reduced.

As shown in FIG. 15, in some embodiments, the first routings 100L, the first routings 100R, and the second routings 100G are connected within the range of the display screen D in a manner similar to FIG. 2, that is, the first routings 100L, the first routings 100R, and the second routings 100G in the third configuration CFG3 follow the principles of "long longitudinally with short horizontally" and "short longitudinally with long horizontally", so that the lengths of each of the first routings 100L, the first routings 100R, and the second routings 100G are all the same.

From the above detailed description of the specific embodiments of the present disclosure, it can be clearly seen that in the routing structure of the display screen of the present disclosure, since the length of the first routings is the same as the length of the second routings, the resistance of the first routings is equal to that of the second routings, so that the brightness of each of the light-emitting units located in the peripheral area of the display screen is the same. In the routing structure of the display screen of the present disclosure, since two ends of the first routings are respectively connected to the driver chips close to the opposite sides of the display screen and the light-emitting units far away from the first side of the display screen, and two ends of the another one of the first routings are respectively connected to the driver chips far away from the opposite sides of the display screen and the light-emitting units close to the first side of the display screen, the length of each of the first routings being the same can be achieved. Accordingly, the routing structure of the display screen of the present disclosure can solve the problem that the light-emitting unit cannot emit light uniformly.

Although the present disclosure has been described in considerable detail with reference to certain embodiments thereof, other embodiments are possible. Therefore, the spirit and scope of the appended claims should not be limited to the description of the embodiments contained herein.

What is claimed is:

1. A routing structure of a display screen, comprising:
   a circuit board located at a first side of the display screen comprising a plurality of sub-pixel units;
   a plurality of driver chips connected to the circuit board and disposed at the first side of the display screen;
   a plurality of first light-emitting units disposed on opposite sides of the display screen, wherein the opposite sides of the display screen are respectively connected to the first side;
   a plurality of second light-emitting units disposed at a second side opposite to the first side of the display screen; and
   a light-emitting unit routing assembly connected to the driver chips, wherein the light-emitting unit routing assembly comprises:
      a plurality of first routings connected between at least one of the driver chips and the first light-emitting units; and
      a plurality of second routings connected between at least one of the driver chips and the second light-emitting units; and
      a plurality of dummy routings,
   wherein the display screen has 3M of routing inlets located at the first side, and the 3M of routing inlets are configured to accommodate the first routings, the second routings, and the dummy routings.

2. The routing structure of the display screen of claim 1, wherein one of the driver chips close to the opposite sides of the display screen is connected to the first light-emitting units away from the first side of the display screen by the first routings, and one of the driver chips away from the opposite sides of the display screen is connected to the first light-emitting units close to the first side of the display screen by the first routings.

3. The routing structure of the display screen of claim 1, further comprising a display screen routing and a glass substrate, wherein the display screen routing is disposed on a side of the glass substrate, and the light-emitting unit routing assembly is disposed on the other side of the glass substrate.

4. The routing structure of the display screen of claim 1, further comprising a display screen routing, a first substrate, and a second substrate located over the first substrate.

5. The routing structure of the display screen of claim 4, wherein the display screen routing is disposed on the first substrate, and the light-emitting unit routing assembly is disposed on the second substrate.

6. The routing structure of the display screen of claim 1, wherein the first routings, the second routings, and the dummy routings are alternately disposed at an end of the display screen close to the 3M of routing inlets.

7. The routing structure of the display screen of claim 1, wherein the first routings, the second routings, and the dummy routings are respectively convergently arranged at an end of the display screen close to the 3M of routing inlets.

8. A routing structure of a display screen, comprising:
   a circuit board located at a first side of the display screen comprising a plurality of sub-pixel units;
   a plurality of first light-emitting units disposed on opposite sides of the display screen, wherein the opposite sides of the display screen are respectively connected to the first side;

a plurality of second light-emitting units disposed at a second side opposite to the first side of the display screen; and a light-emitting unit routing assembly connected to the circuit board, wherein the light-emitting unit routing assembly comprises:

a plurality of first routings connected to the first light-emitting units; and a plurality of second routings connected to the second light-emitting units; and a plurality of ground routings; and a bus wire surrounding a peripheral area of the display screen and electrically connected to the ground routings, wherein a resolution of the display screen is M*N, the display screen accommodates 3M of the sub-pixel units in an extending direction of the first side or the second side, and the display screen accommodates N of the sub-pixel units in a direction from the first side to the second side, wherein the display screen has 3M of routing inlets located at the first side, and the 3M of routing inlets are configured to accommodate the first routings, the second routings, and the ground routings.

9. The routing structure of the display screen of claim 8, wherein the first routings, the second routings, and the ground routings are alternately arranged at an end of the display screen close to the 3M of routing inlets.

10. The routing structure of the display screen of claim 8, wherein signals of the bus wire and the ground routings are VSS signals.

11. A routing structure of a display screen, comprising:

a circuit board located at a first side of the display screen;

a plurality of driver chips connected to the circuit board and disposed at the first side of the display screen;

a plurality of first light-emitting units disposed on opposite sides of the display screen, wherein the opposite sides of the display screen are respectively connected to the first side;

a plurality of second light-emitting units disposed at a second side opposite to the first side of the display screen; and a light-emitting unit routing assembly connected to the driver chips, wherein the light-emitting unit routing assembly comprises:

a plurality of first routings connected between at least one of the driver chips and the first light-emitting units, wherein a difference between a total length of one of the first routings and a total length of another one of the first routings is less than or equal to 2%; and a plurality of second routings connected between at least one of the driver chips and the second light-emitting units, wherein the first routings are divided into a plurality of first light-emitting unit routings and a plurality of second light-emitting unit routings, wherein each of the first light-emitting unit routings comprises a first longitudinal routing segment and a first lateral routing segment, each of the second light-emitting unit routings comprises a second longitudinal routing segment and a second lateral routing segment, the first longitudinal routing segment and the second longitudinal routing segment are extended in a direction from the first side to the second side, and the first lateral routing segment and the second lateral routing segment are extended in a direction from a side of the opposite sides of the display screen to the other side of the opposite sides of the display screen.

12. The routing structure of the display screen of claim 11, wherein the first longitudinal routing segment and the second longitudinal routing segment are on the same layer.

13. The routing structure of the display screen of claim 11, wherein the first lateral routing segment and the second lateral routing segment are on the same layer.

14. The routing structure of the display screen of claim 11, wherein the first longitudinal routing segment and the first lateral routing segment are in different layers.

15. The routing structure of the display screen of claim 11, wherein the second longitudinal routing segment and the second lateral routing segment are in different layers.

16. The routing structure of the display screen of claim 11, wherein the first longitudinal routing segment is connected to the first lateral routing segment by a via, and the second longitudinal routing segment is connected to the second lateral routing segment by another via.

17. The routing structure of the display screen of claim 11, further comprising a display screen routing separated from the light-emitting unit routing assembly, wherein the first lateral routing segment and the second lateral routing segment have a width, the first longitudinal routing segment and the second longitudinal routing segment have a width, and the width of the first lateral routing segment and the second lateral routing segment and the width of the first longitudinal routing segment and the second longitudinal routing segment are less than a width of the display screen routing.

18. The routing structure of the display screen of claim 11, wherein a lateral length of one of the first routings parallel to an extending direction of the first side or the second side is X1, a longitudinal length of the one of the first routings parallel to a direction from the first side to the second side is Y1, a lateral length of another one of the first routings parallel to the extending direction of the first side or the second side is X2, and a longitudinal length of the another one of the first routings parallel to the direction from the first side to the second side is Y2, wherein X1 is greater than Y1, and X2 is less than Y2.

* * * * *